United States Patent
Wang et al.

(10) Patent No.: US 9,813,214 B2
(45) Date of Patent: Nov. 7, 2017

(54) METHOD, APPARATUS AND SYSTEM FOR FEEDING BACK EARLY STOP DECODING

(71) Applicant: ZTE Corporation, Shenzhen (CN)

(72) Inventors: Meiying Wang, Shenzhen (CN); Jiewei Ding, Shenzhen (CN); Tao Liu, Shenzhen (CN)

(73) Assignee: XI'AN ZHONGXING NEW SOFTWARE CO. LTD, Xi'An (CN)

( * ) Notice: Subject to any disclaimer, the term of this patent is extended or adjusted under 35 U.S.C. 154(b) by 79 days.

(21) Appl. No.: 14/758,055

(22) PCT Filed: Sep. 6, 2013

(86) PCT No.: PCT/CN2013/083080
§ 371 (c)(1),
(2) Date: Jun. 26, 2015

(87) PCT Pub. No.: WO2014/101465
PCT Pub. Date: Jul. 3, 2014

(65) Prior Publication Data
US 2015/0358135 A1   Dec. 10, 2015

(30) Foreign Application Priority Data

Dec. 27, 2012  (CN) .......................... 2012 1 0580220

(51) Int. Cl.
*H04W 4/00* (2009.01)
*H04L 5/00* (2006.01)
(Continued)

(52) U.S. Cl.
CPC ...... *H04L 5/0053* (2013.01); *H03M 13/6525* (2013.01); *H04L 1/0025* (2013.01);
(Continued)

(58) Field of Classification Search
CPC combination set(s) only.
See application file for complete search history.

(56) References Cited

U.S. PATENT DOCUMENTS 6,781,970 B1   8/2004  Onesjoe
9,112,672 B2 *  8/2015  Chizgi ................. H04L 1/0039
(Continued)

FOREIGN PATENT DOCUMENTS

CN   1516376 A    7/2004
CN   102427601 A   4/2012
(Continued)

OTHER PUBLICATIONS

3GPP TR 25.702 V12.1.0, Technical Report, 197 pages, Dec. 2013.*

(Continued)

*Primary Examiner* — Frank Duong
(74) *Attorney, Agent, or Firm* — Cantor Colburn LLP

(57) ABSTRACT

A method, apparatus and system for feeding back early stop decoding are provided. The method includes: a terminal side adjusting encoded TFCI bits, and sending the adjusted TFCI bits to a NodeB side via a TFCI domain of an uplink DPCCH (S302); after sending the adjusted TFCI bits to the NodeB side, the terminal side performing a decoding operation on a downlink DPCH, and feeding back, via an idle TFCI domain of the uplink DPCCH, a decoding result to the NodeB side (304). By applying the technical solution, at least one of the problems in the related art that a NodeB cannot obtain a TFCI in time and a terminal side cannot feed back a downlink decoding result in time during early stop decoding can be solved.

16 Claims, 6 Drawing Sheets

(51) Int. Cl.
    *H04L 1/00*          (2006.01)
    *H04W 72/04*        (2009.01)
    *H04W 52/14*        (2009.01)
    *H04W 16/00*        (2009.01)
    *H03M 13/00*        (2006.01)
    *H03M 13/29*        (2006.01)
    *H03M 13/37*        (2006.01)
    *H04L 1/16*          (2006.01)

(52) U.S. Cl.
    CPC .......... *H04L 1/0029* (2013.01); *H04L 1/0039* (2013.01); *H04L 1/0044* (2013.01); *H04L 1/0053* (2013.01); *H04W 16/00* (2013.01); *H04W 52/146* (2013.01); *H04W 72/0413* (2013.01); *H04W 72/0446* (2013.01); *H03M 13/2975* (2013.01); *H03M 13/3753* (2013.01); *H04L 1/1607* (2013.01)

(56) References Cited

U.S. PATENT DOCUMENTS

| | | |
|---|---|---|
| 2006/0176976 A1 | 8/2006 | Pedersen |
| 2007/0218883 A1 | 9/2007 | Sebire |
| 2012/0281675 A1 | 11/2012 | Jiye |
| 2014/0293847 A1* | 10/2014 | Tsai .................. H04L 5/14 370/281 |
| 2014/0334363 A1* | 11/2014 | Li .................. H04W 52/58 370/311 |
| 2015/0049690 A1* | 2/2015 | Sambhwani .......... H04L 1/0053 370/329 |

FOREIGN PATENT DOCUMENTS

| | | |
|---|---|---|
| CN | 102668612 A | 9/2012 |
| WO | 0178292 A2 | 10/2001 |

OTHER PUBLICATIONS

International Search Report for corresponding application PCT/CN2013/083080 filed Sep. 6, 2013; dated Dec. 19, 2013.

European Search Report for corresponding application EP13867361; Report dated Nov. 12, 2015.

\* cited by examiner

METHOD, APPARATUS AND SYSTEM FOR FEEDING BACK EARLY STOP DECODING

TECHNICAL FIELD

The present disclosure relates to the field of mobile communication, including, e.g., a method, apparatus and system for feeding back early stop decoding.

BACKGROUND

The development and popularization of mobile networks including Global System of Mobile communication (GSM) etc. in the past 20 years have brought great success to global mobile voice communication services. With the rapid development of personal voice services, wireless data networks have also developed from General Packet Radio Service (GPRS) technology/High Speed Packet Access (HSPA) technology towards Long Term Evolution (LTE) systems, which can provide a high bandwidth wireless access network to better support various mobile applications. However, there are also hidden risks, the most serious of which is resulted from Voice over Internet Protocol (VOIP).

LTE, which is an Internet Protocol (IP) architecture based on an IP Multimedia Subsystem (IMS), is able to realize a voice based on Packet Switching (PS). However, compared with a traditional Circuit Switching (CS) voice service, a voice service based on a PS domain, which has disadvantages including high call drop rate, long call delay, and poor security performance and so on, can hardly achieve the same call service experience as that of the traditional CS voice service. After concerted efforts of the $3^{rd}$ Generation Partnership Project (3GPP) industry, CS Fall Back (CSFB), i.e., going back to the Second Generation (2G) or the Third Generation (3G) is believed to be an important step to evolve from a CS network to a full IP process. That is, a user resides in an LTE network, when making or answering a voice call, User Experience (UE) access is switched from the LTE network to a 2G/3G network, thereby realizing a voice service in the CS domain of the 2G/3G.

Therefore, traditional CS voice services need to be further developed, because a user still needs to use a traditional CS voice service when making or answering a voice call even in a 4G LTE network. In the meanwhile, with the rapid development of voice services and data services, system capacities of R99 CS voice services need to be improved, or higher data services need to be supported in the condition of the same number of R99 users.

It can be learned according to protocols that settings of a traditional R99 CS 12.2k voice service are as follows: Adaptive Multi-Rate (AMR) coding, 20 ms Transmit Time Interval (TTI), 1/3 convolutional coding and fixed rate-matching. Through simulating based on traditional R99 CS 12.2k voice services, a variety of companies found that a UE can perform decoding successfully without receiving all data of one TTI. FIG. 1 is a schematic diagram showing the accuracy of downlink early stop decoding according to the related art. The horizontal axis in FIG. 1 represents the decoding time (ms) and the vertical axis represents the decoding accuracy. As shown in FIG. 1, data of a 20 ms TTI can be basically decoded successfully within 12 ms to 18 ms, which means that the data after the successfully-decoded data is no longer necessary. In order to reduce such unnecessary power transmission and reduce interference, the industry proposes an early stop decoding mechanism for the R99 service.

The so-called early stop decoding mechanism is explained as follows. For an uplink, a Node B (NodeB) decodes a Dedicated Physical Data Channel (DPDCH) at intervals within each TTI and feeds back a decoding result to a UE. After the decoding succeeds, the UE stops transmission of the DPDCH in the TTI and starts transmission again when the next TTI arrives. For a downlink, the UE decodes a Dedicated Physical Channel (DPCH) at intervals within each TTI and feeds back a decoding result to the NodeB. After the decoding succeeds, the NodeB stops transmission of a DPDCH in the TTI and starts transmission again when the next TTI arrives. After the decoding of the DPDCHs of both the uplink and the downlink succeeds, the UE and the NodeB stop transmission of a Dedicated Physical Control Channel (DPCCH) in the TTI simultaneously and start transmission again when the next TTI arrives. Thus, in order to realize early stop decoding, for the uplink, two conditions must be satisfied: the NodeB should be enabled to acquire a Transport Format Combination Indicator (TFCI) as soon as possible, and the decoding result of the downlink can be fed back to the NodeB to notify the NodeB to stop transmission of the DPDCH in the TTI.

In a traditional R99 service, there are only two channels in the uplink, i.e., a Dedicated Physical Control Channel (DPCCH) and a DPDCH. The DPCCH is used for sending control information including a Pilot, a TFCI and Transmission power Control (TPC) etc. while the DPDCH is used for sending data information, excluding the feedback information about a downlink decoding result. The TFCI includes 10 original bits. After encoding the 10 original bits according to [32,10], the first 30 bits are uniformly distributed in 15 slots of the DPCCH, and a NodeB at least needs 10 ms to obtain a TFCI decoding result. FIG. 2 is a schematic diagram showing the accuracy of uplink early stop decoding according to the related art. The horizontal axis in FIG. 2 represents the decoding time (ms) and the vertical axis represents the decoding accuracy. As shown in FIG. 2, a NodeB may start to try decoding at about 6 ms. It can be seen that the TFCI design in the related art can hardly satisfy requirements of early stop decoding, thus resulting in poor early stop decoding effect of a UE and a NodeB.

At present, there is no effective solution to solve at least one of the problems in the related art that a NodeB side cannot obtain a TFCI in time and a terminal side cannot feed back a downlink decoding result in time during early stop decoding.

SUMMARY

To solve at least one of the problems in the related art that a NodeB side cannot obtain a TFCI in time and a terminal side cannot feed back a downlink decoding result in time during early stop decoding, the embodiments of the present disclosure provide a method, apparatus and system for feeding back early stop decoding to solve the technical problems above.

According to an aspect of the embodiments of the present disclosure, an embodiment of the present disclosure provides a method for feeding back early stop decoding, wherein the method includes: a terminal side adjusts encoded TFCI bits, and sends the adjusted TFCI bits to a NodeB side via a TFCI domain of a DPCCH; after sending the adjusted TFCI bits to the NodeB side, the terminal side performs a decoding operation on a downlink DPCH and feeds back, via an idle TFCI domain of the uplink DPCCH, a decoding result to the NodeB side.

In an example embodiment, the terminal side adjusting the encoded TFCI bits may include: the terminal side performs a reduction operation on original TFCI bits; and/or the terminal side encodes the original TFCI bits by using a high code rate encoding method.

In an example embodiment, before sending the adjusted TFCI bits to the NodeB side via the TFCI domain of the uplink DPCCH, the method may further include: the terminal side increases proportion of the TFCI domain in the uplink DPCCH.

In an example embodiment, the method may further include: the terminal side increases transmitting power of the TFCI domain of the uplink DPCCH.

According to another aspect of the embodiments of the present disclosure, an embodiment of the present disclosure further provides a method for feeding back early stop decoding, wherein the method includes: a NodeB side receives encoded TFCI bits sent by a terminal side, wherein the encoded TFCI bits are TFCI bits obtained after the terminal side performs a bit reduction operation; the NodeB side performs a decoding operation on the received TFCI bits, performs, according to a decoding result of the decoding operation performed on the received TFCI bits, a decoding operation on an uplink DPDCH, and feeds back a decoding result of the decoding operation performed on the uplink DPDCH to the terminal side.

In an example embodiment, the terminal side performing the bit reduction operation may include: the terminal side performs the bit reduction operation on original TFCI bits, and/or the terminal side encodes the original TFCI bits by using a high code rate encoding method.

According to another aspect of the embodiments of the present disclosure, an embodiment of the present disclosure further provides an apparatus for feeding back early stop decoding, the apparatus being applied to a terminal side, wherein the apparatus includes: an adjusting component, configured to adjust encoded TFCI bits, and send the adjusted TFCI bits to a NodeB side via a TFCI domain of an uplink DPCCH; a feedback component configured to, after the adjusted TFCI bits are sent to the NodeB side, perform a decoding operation on a downlink DPCH and feed back, via an idle TFCI domain of the uplink DPCCH, the decoding result to the NodeB side.

In an example embodiment, the adjusting component may include: a reducing element, configured to perform a reduction operation on original TFCI bits; and/or an encoding element, configured to encode, by the terminal side, the original TFCI bits by using a high code rate encoding method.

According to another aspect of the embodiments of the present disclosure, an embodiment of the present disclosure further provides an apparatus for feeding back early stop decoding, the apparatus being applied to a NodeB side, wherein the apparatus includes: a receiving component, configured to receive encoded TFCI bits sent by a terminal side, wherein the encoded TFCI bits are TFCI bits obtained after the terminal side performs a bit reduction operation; a decoding operation component, configured to perform a decoding operation on the received TFCI bits; a decoding feedback component, configured to perform, according to a decoding result of the decoding operation performed on the received TFCI bits, a decoding operation on an uplink DPDCH, and feed back a decoding result of the decoding operation performed on the uplink DPDCH to the terminal side.

According to another aspect of the embodiments of the present disclosure, an embodiment of the present disclosure further provides a system for feeding back early stop decoding, wherein the system includes: the apparatus for feeding back early stop decoding applied to a terminal side and the apparatus for feeding back early stop decoding applied to a NodeB side.

Through the embodiments of the present disclosure, a terminal side adjusts encoded TFCI bits, and sends the adjusted TFCI bits to a NodeB side via a TFCI domain of a DPCCH; and after performing a decoding operation on a downlink DPCH, feeds back, via an idle TFCI domain of the uplink DPCCH, the decoding result to the NodeB side, thus solving at least one of the problems in the related art that a NodeB cannot obtain a TFCI in time and a terminal side cannot feed back a downlink decoding result in time during early stop decoding. By virtue of the technical solution, without adding a new code channel, a TFCI domain of a DPCCH is fully used, and the transmitting power of a terminal is saved. Meanwhile, the number of times for the terminal and the NodeB to try early stop decoding is decreased, thus decoding resources are saved.

DETAILED DESCRIPTION OF EMBODIMENTS

To solve the problem of poor early stop decoding effect of a terminal side and a NodeB side in the related art, the embodiments of the present disclosure provide a method, apparatus and system for feeding back early stop decoding. The present disclosure will be further described in details below in conjunction with the accompanying drawings and embodiments. It should be understood that the specific embodiments described herein are only used for explaining the present disclosure, instead of limiting the present disclosure.

Figure 3:
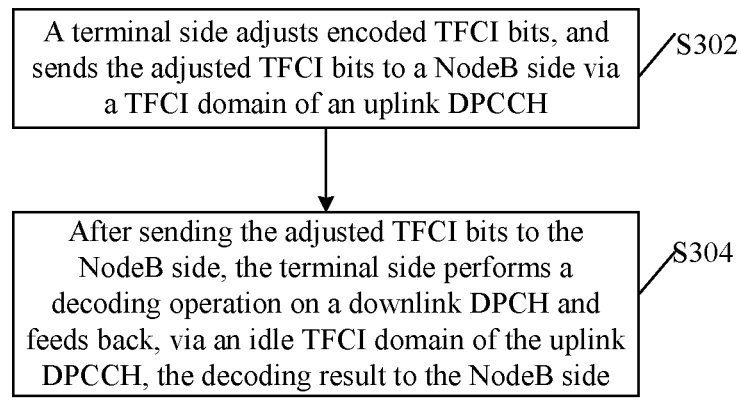
FIG. 3 is a flowchart of a method for feeding back early stop decoding of a terminal side according to an embodiment of the present disclosure.

The present embodiment provides a method for feeding back early stop decoding. The method may be implemented at a terminal side. FIG. 3 is a flowchart of a method for feeding back early stop decoding of a terminal side according to an embodiment of the present disclosure. As shown in FIG. 3, the method includes the following steps (Step 302 to Step 304).

Step 302: a terminal side adjusts encoded TFCI bits, and sends the adjusted TFCI bits to a NodeB side via a TFCI domain of an uplink DPCCH.

Step 304: after sending the adjusted TFCI bits to the NodeB side, the terminal side performs a decoding operation on a downlink DPCH and feeds back, via an idle TFCI domain of the uplink DPCCH, the decoding result to the NodeB side.

Through the method, the terminal side adjusts the encoded TFCI bits, and sends, via the TFCI domain of the DPCCH, to the NodeB side the adjusted TFCI bits; and after performing the decoding operation on the downlink DPCH, feeds back, via the idle TFCI domain of the uplink DPCCH, the decoding result to the NodeB side, thus solving at least one of the problems in the related art that a NodeB cannot obtain a TFCI in time and a terminal side cannot feed back a downlink decoding result in time during early stop decoding. By virtue of this technical solution, without adding a new code channel, a TFCI domain of a DPCCH is fully used, and the transmitting power of a terminal is saved. Meanwhile, the number of times for the terminal and the NodeB to try early stop decoding is decreased, thus decoding resources are saved.

For an R99 service, there are far less than 1024 TFCI combinations in actual services at present. Therefore, it is too many to specify 10 bits for a TFCI in 3GPP protocols, and so, the bits of the TFCI may be adjusted to reduce the number of the bits of the TFCI, so as to complete transmission of the TFCI before early stop decoding is tried for the first time. Based on this, the present embodiment provides an example implementation, that is, the terminal side may adjust the TFCI bits in the following manner: the terminal side performs a reduction operation on original TFCI bits; and/or the terminal side encodes the original TFCI bits by using a high code rate encoding method.

Through the example embodiment, the number of original bits of the TFCI is reduced, and by using the encoding method with the same code rate, the number of the encoded TFCI bits is reduced. Alternatively, the number of the original bits of the TFCI is not adjusted, and the TFCI is encoded by using the encoding method with a relatively high code rate; in this way, the number of bits of the encoded TFCI is less than the number of bits of a TFCI which is obtained by a general encoding operation, thereby reducing the number of the encoded TFCI bits. Alternatively, the number of the original bits of the TFCI is reduced, and the TFCI is encoded by using the encoding method with a relatively high code rate, thus reducing the number of the encoded TFCI bits.

To enable the NodeB side to obtain the TFCI earlier, and improve the accuracy of the TFCI encoding of the NodeB side and the accuracy of feeding back the downlink encoding result by the terminal, the method may further include: the terminal side increases proportion of the TFCI domain in the uplink DPCCH, and the terminal side increases transmitting power of the TFCI domain of the uplink DPCCH.

Figure 4:
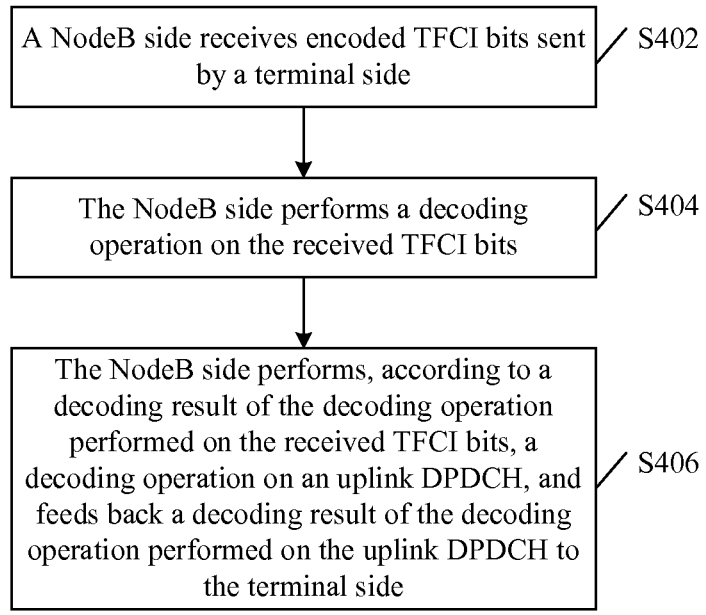
FIG. 4 is a flowchart of a method for feeding back early stop decoding of a NodeB side according to an embodiment of the present disclosure.

Corresponding to the method for feeding back early stop decoding of a terminal side according to the embodiment above, the present embodiment provides a method for feeding back early stop decoding which may be implemented at a NodeB side. FIG. 4 is a flowchart of a method for feeding back early stop decoding of a NodeB side according to an embodiment of the present disclosure. As shown in FIG. 4, the method includes the following steps (Step 402 to Step 406).

Step 402: a NodeB side receives encoded TFCI bits sent by a terminal side, wherein the encoded TFCI bits are TFCI bits obtained after the terminal side performs a bit reduction operation.

Step 404: the NodeB side performs a decoding operation on the received TFCI bits.

Step 406: the NodeB side performs, according to a decoding result of the decoding operation performed on the received TFCI bits, a decoding operation on an uplink DPDCH, and feed back a decoding result of the decoding operation performed on the uplink DPDCH to the terminal side.

Through the method above, after receiving the TFCI bits adjusted by the terminal side, the NodeB side performs the decoding operation, performs the decoding operation for the uplink DPDCH according to the decoding result of the TFCI, and finally feeds back the decoding result for the uplink DPDCH to the terminal side, thus solving the problem in the related art that a NodeB side cannot obtain a TFCI in time during early stop decoding. By virtue of the technical solution, without adding a new code channel, a TFCI domain of a DPCCH is fully used, and the transmitting power of a terminal is saved. Meanwhile, the NodeB side starts trying to perform decoding for an uplink DPDCH only after the terminal side finishes transmission of the TFCI, thus the number of times for the NodeB to try early stop decoding is decreased and decoding resources are saved.

For the bit reduction operation performed by the terminal side, the present embodiment provides an example implementation, that is, the terminal side may perform the bit reduction operation in the following manner: the terminal side performs the bit reduction operation on original TFCI bits, and/or the terminal side encodes the original TFCI bits by using a high code rate encoding method. The operation of reducing the number of the bits of the TFCI by the terminal side has been described before and will not be repeated here.

By reducing the number of the bits of the TFCI, the present embodiment may be able to complete transmission of the TFCI before early stop decoding is tried for the first time, and can use an idle TFCI domain of the several slots after the DPCCH to feed back the downlink early stop decoding result. A specific implementation method is described as follows.

Step 1: within one TTI, a UE reduces encoded TFCI bits (i.e. equivalent to reducing the number of the encoded TFCI bits), and uses a TFCI domain of a DPCCH to transmit the TFCI bits, so that the transmission of the TFCI bits is able to be finished within one frame.

Step 2: after receiving all the encoded TFCI bits, a NodeB starts decoding the TFCI, and decodes an uplink DPDCH according to a decoding result of the TFCI.

Step 3: after finishing transmission of the encoded TFCI bits, the UE starts decoding a downlink DPCH and uses an idle TFCI domain in each slot of the DPCCH after the slots for transmitting the TFCI bits within this TTI to feed back a downlink decoding result.

Through the implementation method, it is unnecessary to add a new code channel in the uplink and the transmitting power of the UE is saved. Meanwhile, the number of times for the NodeB to try early stop decoding is decreased, and the NodeB may start trying decoding after the TFCI is decoded, thereby saving decoding resources.

The method for feeding back early stop decoding will be introduced through an example embodiment below. Within one TTI, the terminal reduces the number of the original bits of the TFCI and uses a new encoding method to reduce the number of the encoded TFCI bits. There are maximally 127 TFCI combinations in actual services at present, which means that a 7 bit TFCI is enough. Therefore, in this example embodiment, TFCI encoding is changed from the original [32,10] to [20,7]. A spreading factor SP=256 of the DPCCH remains unchanged. The proportion of a TFCI domain in each slot of the DPCCH is increased, i.e. the slotformat of the DPCCH is changed from the traditional [6 2 0 2] into [5 3 0 2], which means that in the 10-bit symbols of one slot, the pilot occupies 5 bits, the TFCI occupies 3 bits, Feedback Information (FBI) occupies 0 bit, and TPC occupies 2 bits, thus it only needs 7 slots to finish transmission of a 20 bit TFCI.

After receiving all encoded TFCI bits, the NodeB performs decoding for the TFCI, and performs, according to the decoding result of the TFCI, a decoding operation to the uplink DPDCH.

After finishing transmission of the TFCI bits, the terminal starts decoding the downlink DPCH, and uses an idle TFCI domain in each slot of the DPCCH after the slots for transmitting the TFCI bits within the current TTI to feed back the downlink decoding result. The encoding method as shown in Table 1 is applied to feedback the result of early stop decoding.

TABLE 1

| ACK | [1 1 1] |
| NACK | [0 0 0] |

The [20,7] encoding method used for the TFCI is the same as the single-carrier Multiple-Input and Multiple-Output (MIMO) Channel Quality Indicator (CQI) TypeB encoding method in protocol 25.212. Provided that the input is $a=(a_0 a_1 a_2 a_3 a_4 a_5 a_6)$, and the output is $b=(b_0 b_1 \ldots b_{19})$, then $$b_i = \left( \sum_{n=0}^{1} (a_n \times M_{i,n}) + \sum_{n=2}^{4} (a_n \times M_{i,n+1}) + a_5 \times M_{i,7} + a_6 \times M_{i,10} \right) \bmod 2.$$

The values of M are as shown in Table 2.

TABLE 2

| i | Mi, 0 | Mi, 1 | Mi, 2 | Mi, 3 | Mi, 4 | Mi, 5 | Mi, 6 | Mi, 7 | Mi, 8 | Mi, 9 | Mi, 10 |
|---|---|---|---|---|---|---|---|---|---|---|---|
| 0 | 1 | 0 | 0 | 0 | 0 | 0 | 0 | 0 | 0 | 0 | 0 |
| 1 | 0 | 1 | 0 | 0 | 0 | 0 | 0 | 0 | 0 | 0 | 0 |
| 2 | 0 | 0 | 0 | 1 | 0 | 0 | 0 | 0 | 0 | 0 | 0 |
| 3 | 0 | 0 | 0 | 0 | 1 | 0 | 0 | 0 | 0 | 0 | 0 |
| 4 | 0 | 0 | 0 | 0 | 0 | 1 | 0 | 0 | 0 | 0 | 0 |
| 5 | 0 | 0 | 0 | 0 | 0 | 0 | 0 | 1 | 0 | 0 | 0 |
| 6 | 0 | 0 | 0 | 0 | 0 | 0 | 0 | 0 | 1 | 0 | 1 |
| 7 | 0 | 0 | 0 | 0 | 0 | 0 | 0 | 0 | 0 | 1 | 1 |
| 8 | 1 | 0 | 1 | 0 | 0 | 0 | 1 | 1 | 1 | 0 | 1 |
| 9 | 1 | 1 | 0 | 1 | 0 | 0 | 0 | 1 | 1 | 1 | 1 |
| 10 | 0 | 1 | 1 | 0 | 1 | 0 | 0 | 0 | 1 | 1 | 1 |
| 11 | 1 | 0 | 1 | 1 | 0 | 1 | 0 | 0 | 0 | 1 | 0 |
| 12 | 1 | 1 | 0 | 1 | 1 | 0 | 1 | 0 | 0 | 0 | 0 |
| 13 | 1 | 1 | 1 | 0 | 1 | 1 | 0 | 1 | 0 | 0 | 0 |
| 14 | 0 | 1 | 1 | 1 | 0 | 1 | 1 | 0 | 1 | 0 | 1 |
| 15 | 0 | 0 | 1 | 1 | 1 | 0 | 1 | 1 | 0 | 1 | 0 |
| 16 | 0 | 0 | 0 | 1 | 1 | 1 | 0 | 1 | 1 | 0 | 1 |
| 17 | 1 | 0 | 0 | 0 | 1 | 1 | 1 | 0 | 1 | 1 | 0 |
| 18 | 0 | 1 | 0 | 0 | 0 | 1 | 1 | 1 | 0 | 1 | 0 |
| 19 | 1 | 1 | 1 | 1 | 1 | 1 | 1 | 1 | 1 | 1 | 1 |

Figure 1:
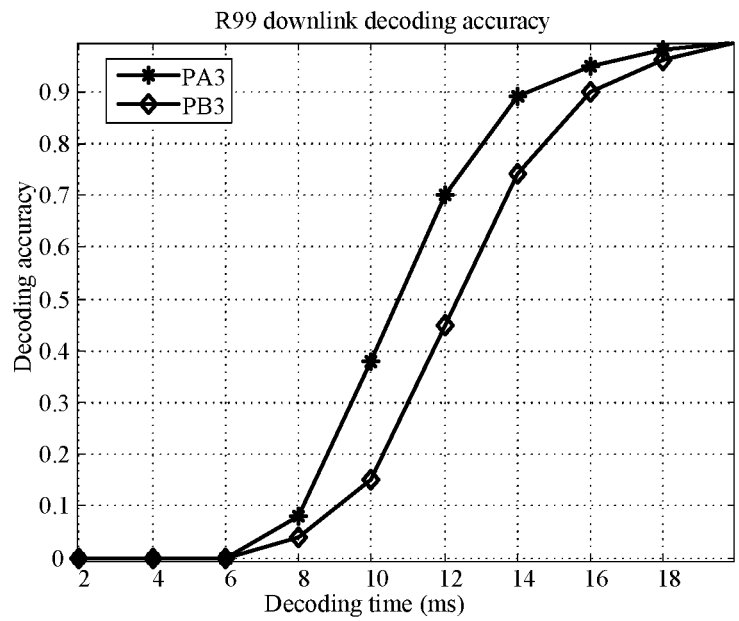
FIG. 1 is a schematic diagram showing the accuracy of downlink early stop decoding according to the related art.
Figure 2:
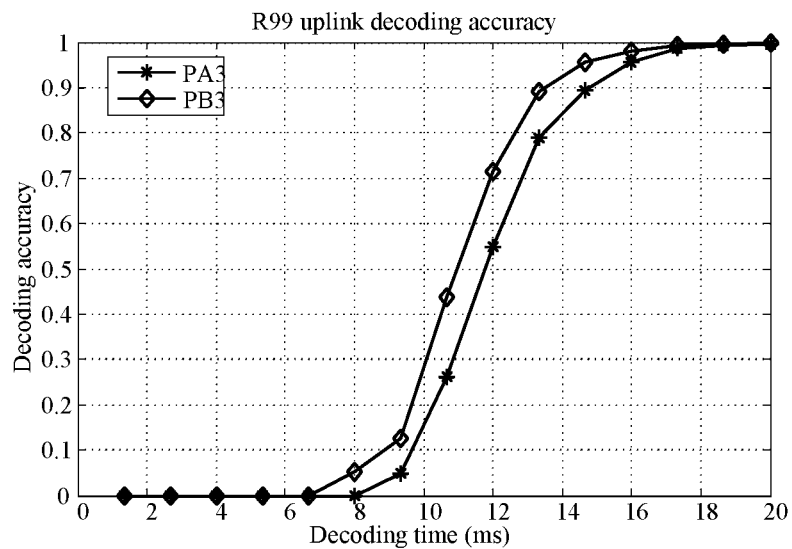
FIG. 2 is a schematic diagram showing the accuracy of uplink early stop decoding according to the related art.
Figure 5:
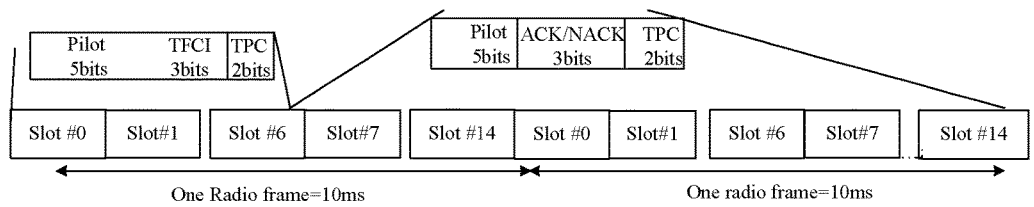
FIG. 5 is a structural diagram of a new DPCCH frame according to an embodiment of the present disclosure.

FIG. 5 is a structural diagram of a new DPCCH frame according to an embodiment of the present disclosure. It can be seen from FIG. 5 that, for the DPCCH, slotformat=[5 3 0 3], which means that in 10 bit symbols of a slot, the pilot occupies 5 bits, the TFCI occupies 3 bits, FBI occupies 0 bit, and TPC occupies 2 bits. For a 20 ms TTI, TFCI domains of the first 7 slots are used for transmitting the TFCI and TFCI domains of the several slots after the first 7 slots are used for feeding back a downlink decoding result. Thus, a NodeB only needs 7 slots to obtain an uplink TFCI, and a terminal may start feeding back a downlink decoding result. That is, an uplink and a downlink may start trying early stop decoding respectively after 4.67 ms. It can be seen according to FIG. 1 and FIG. 2 that, for an R9912.2K CS voice service, the accuracy of early stop decoding of no matter an uplink or a downlink is almost 0 before 6 ms. Thus, by using the design solution of the present disclosure, not only that a TFCI can be transmitted without adding a new code channel and the transmitting power of a UE is saved, meanwhile, the number of times for a NodeB and a UE to try early stop decoding is decreased, and they may start trying decoding 7 slots later, i.e. they may start trying decoding when the accuracy for early stop decoding is relatively high, thereby saving decoding resources.

Figure 6:
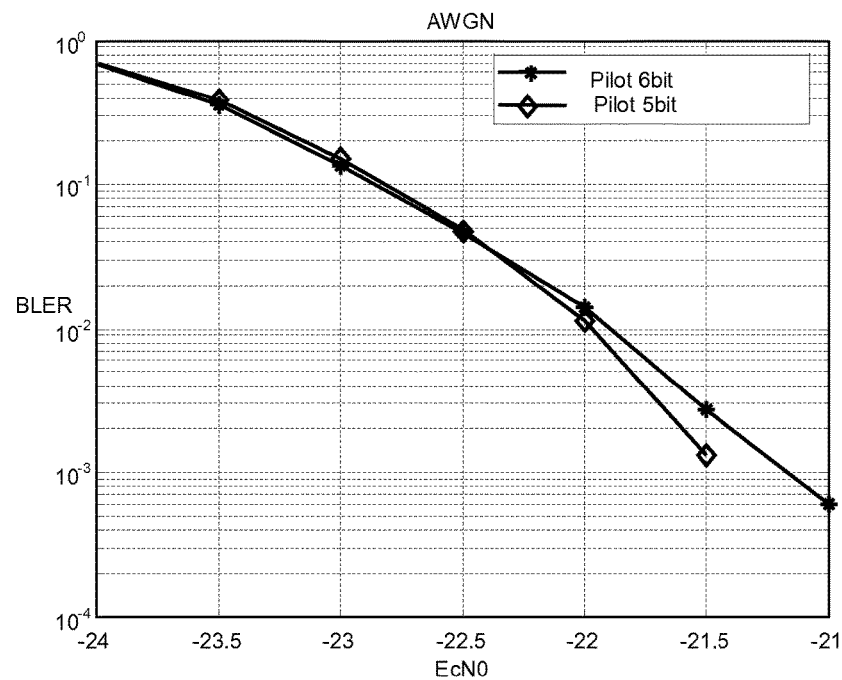
FIG. 6 is a schematic diagram showing performance difference between using 5 bits and using 6 bits for a pilot in an Additive White Gaussian Noise (AWGN) channel condition according to an embodiment of the present disclosure.
Figure 7:
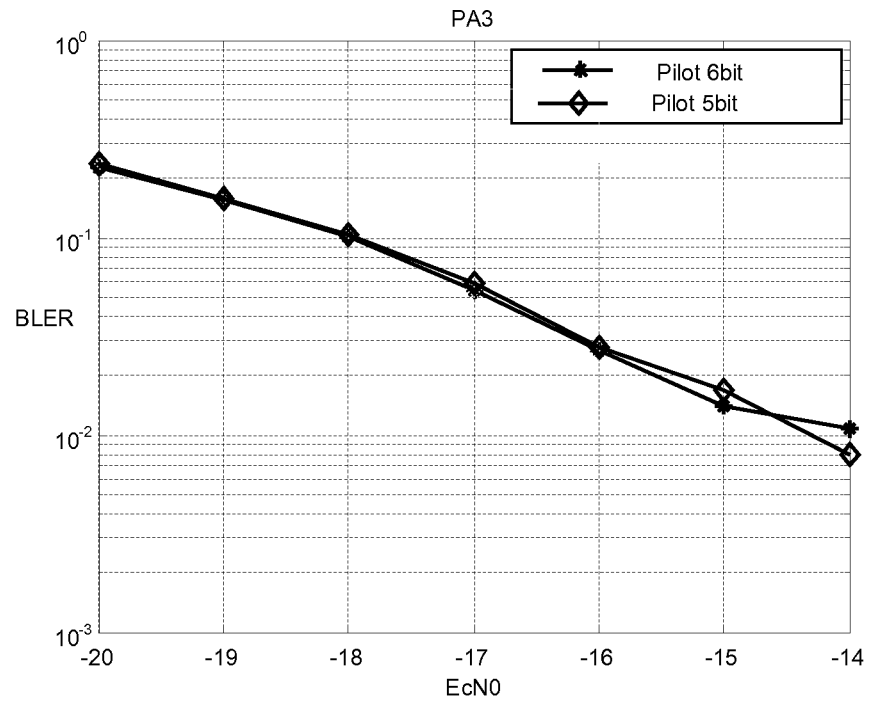
FIG. 7 is a schematic diagram showing performance difference between using 5 bits and using 6 bits for a pilot in a PA3 channel condition according to an embodiment of the present disclosure.

FIG. 6 is a schematic diagram showing performance difference between using 5 bits and using 6 bits for a pilot in an AWGN channel condition according to an embodiment of the present disclosure. FIG. 7 is a schematic diagram showing performance difference between using 5 bits and using 6 bits for a pilot in a PA3 channel condition according to an embodiment of the present disclosure. It can be seen from FIG. 6 and FIG. 7 that compared with the case of using 6 bits for a pilot, there is no negative impact on the decoding performance of a DPDCH by using 5 bits for a pilot, thus it is totally applicable for a DPCCH to use a slotformat of [5 3 0 2].

Figure 8:
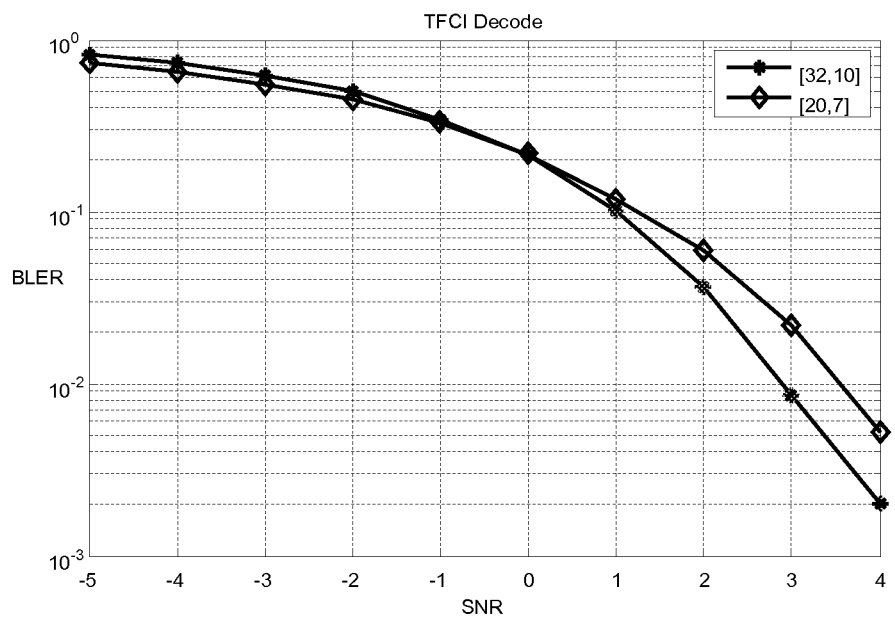
FIG. 8 is a schematic diagram showing performance difference between using [32,10] and using [20,7] to encode a TFCI according to an embodiment of the present disclosure.
Figure 9:
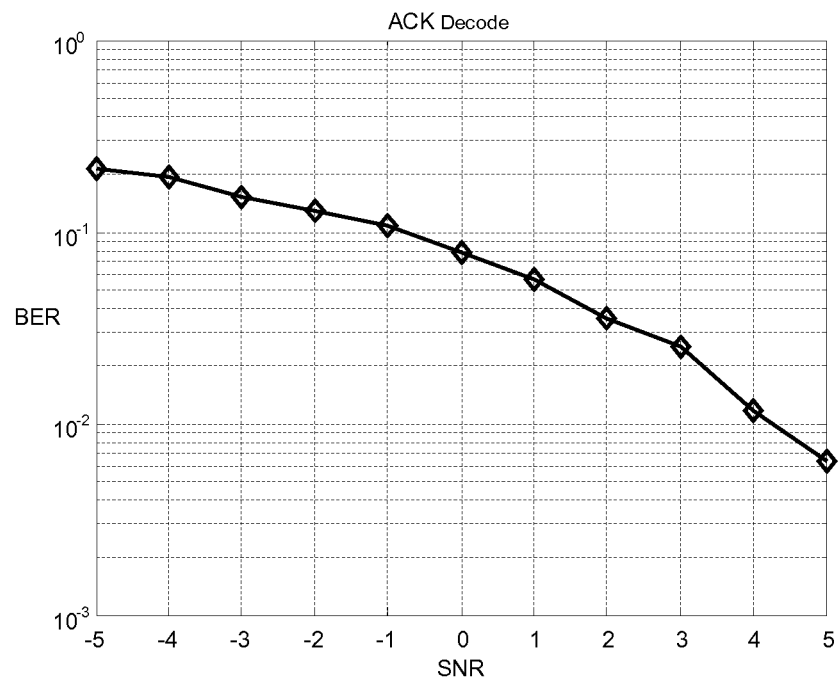
FIG. 9 is a schematic diagram showing the accuracy of feeding back a downlink decoding result by using an idle TFCI domain according to an embodiment of the present disclosure.

FIG. 8 is a schematic diagram showing performance difference between using [32,10] and using [20,7] to encode a TFCI according to an embodiment of the present disclosure. FIG. 9 is a schematic diagram showing the accuracy of feeding back a downlink decoding result by using an idle TFCI domain according to an embodiment of the present disclosure. It can be seen from FIG. 8 and FIG. 9 that the performance of using a [20,7] encoding method is 0.5 dB worse than that using a [32,10] encoding method, and feedback of a downlink decoding result when TFCI is encoded using [20,7] is about 1.2 dB worse than the decoding performance when TFCI is encoded using [32,10]. Therefore, in order to ensure the accuracy of the newly-designed TFCI and the accuracy of downlink decoding result feedback, the transmitting power of a TFCI domain (Acknowledgement (ACK) response/Negative Acknowledgement (NACK) response domain) of a DPCCH channel may be increased while the transmitting power of other domains remains unchanged. During an actual implementation process, the power value that needs to be increased may be determined through a simulation result or a test empirical value.

Figure 10:
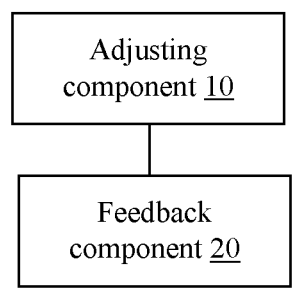
FIG. 10 is a structural block diagram of apparatus for feeding back early stop decoding deployed at a terminal side according to an embodiment of the present disclosure.

Corresponding to the method for feeding back early stop decoding, which is applied to a terminal side, according to the embodiment above, the present embodiment provides an apparatus for feeding back early stop decoding which is deployed at a terminal side to realize the embodiment above. FIG. 10 is a structural block diagram of apparatus for feeding back early stop decoding deployed at a terminal side according to an embodiment of the present disclosure. As shown in FIG. 10, the apparatus includes: an adjusting component 10 and a feedback component 20. The structure will be introduced in details below.

The adjusting component 10 is configured to adjust encoded TFCI bits, and send the adjusted TFCI bits to a NodeB side via a TFCI domain of an uplink DPCCH.

The feedback component 20 is coupled with the adjusting component 10 and configured to perform, after the adjusted TFCI bits are sent to the NodeB side, a decoding operation on a downlink DPCH, and feed back, via an idle TFCI domain of the uplink DPCCH, the decoding result to the NodeB side.

Through the apparatus, the terminal side adjusts the encoded TFCI bits, and sends, via the TFCI domain of the DPCCH, to the NodeB side the adjusted TFCI bits; and after performing the decoding operation on the downlink DPCH, feeds back, via the idle TFCI domain of the uplink DPCCH, the decoding result to the NodeB side, thus solving at least one of the problems in the related art that a NodeB side cannot obtain a TFCI in time and a terminal side cannot feed back a downlink decoding result in time during early stop decoding. By virtue of the technical solution, without adding a new code channel, a TFCI domain of a DPCCH is fully used, and the transmitting power of a terminal is saved. Meanwhile, the number of times for the terminal and the NodeB to try early stop decoding is decreased, thus decoding resources are saved.

For the adjustment operation performed by the adjusting component 10 for the TFCI bits, the present embodiment provides an example structure for implementing the adjustment operation. Specifically, the adjusting component 10 includes: a reducing element, configured to perform a reduction operation on original TFCI bits; and/or an encoding element, configured to encode, by the terminal side, the original TFCI bits by using a high code rate encoding method.

To enable the NodeB side to obtain the TFCI earlier, and improve the accuracy of the TFCI encoding of the NodeB side and the accuracy of feeding back the downlink encoding result by the terminal, the method may further include: the terminal side increases proportion of the TFCI domain in the uplink DPCCH, and the terminal side increases transmitting power of the TFCI domain of the uplink DPCCH.

Figure 11:
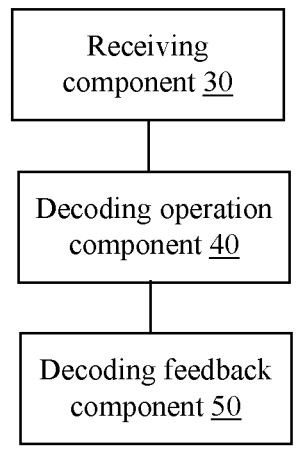
FIG. 11 is a structural block diagram of apparatus for feeding back early stop decoding deployed at a NodeB side according to an embodiment of the present disclosure.

Corresponding to the method for feeding back early stop decoding, which is applied to a NodeB side, according to the embodiment above, the present embodiment provides an apparatus for feeding back early stop decoding which may be deployed at a NodeB side to implement the embodiment above. FIG. 11 is a structural block diagram of apparatus for feeding back early stop decoding deployed at a NodeB side according to an embodiment of the present disclosure. As shown in FIG. 11, the apparatus includes: a receiving component 30, a decoding operation component 40 and a decoding feedback component 50. The structure will be introduced in details below.

The receiving component 30 is configured to receive encoded TFCI bits sent by a terminal side, wherein the encoded TFCI bits are TFCI bits obtained after the terminal side performs a bit reduction operation.

The decoding operation component 40 is coupled with the bit number receiving component 30 and configured to perform a decoding operation on the received TFCI bits.

The decoding feedback component 50 is coupled with the decoding operation component 40 and configured to perform, according to a decoding result of the TFCI decoding operation, a decoding operation on an uplink DPDCH, and feed back a decoding result of the uplink DPDCH decoding operation to the terminal side.

Through the apparatus above, after receiving the TFCI bits adjusted by the terminal side, the NodeB side performs a series of decoding operations, and finally feeds back the decoding result of the uplink DPDCH to the terminal side, thus solving the problem in the related art that a NodeB side cannot obtain a TFCI in time during early stop decoding. By virtue of this technical solution, without adding a new code channel, a TFCI domain of a DPCCH is fully used, and the transmitting power of a terminal is saved. Meanwhile, the NodeB side may start trying to perform decoding for an uplink DPDCH only after the terminal side finishes transmission of the TFCI, thus the number of times for the NodeB to try early stop decoding is decreased and decoding resources are saved.

Figure 12:
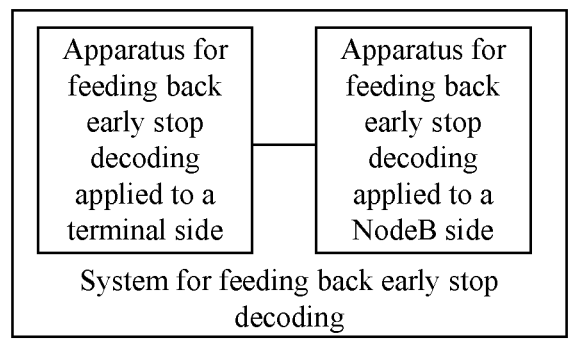
FIG. 12 is a structural block diagram of a system for feeding back early stop decoding according to an embodiment of the present disclosure.

Corresponding to the apparatus for feeding back early stop decoding, which is applied to a terminal side, and the apparatus for feeding back early stop decoding, which is applied to a NodeB side, according to the embodiments above, the present embodiment provides a system for feeding back early stop decoding. According to the structural block diagram of a system for feeding back early stop decoding, as shown in FIG. 12, the system includes the apparatus for feeding back early stop decoding, which is applied to a terminal side, and the apparatus for feeding back early stop decoding, which is applied to a NodeB side, according to the embodiments above.

In the related art, a general decoding method includes: an encoded TFCI of a terminal includes 30 bits, distributed in 15 slots of a DPCCH frame (10 ms) with each slot including 2 bits; a NodeB performs decoding for an uplink DPDCH at a TTI of 20 ms according to a decoding result of the TFCI and does not need to feed back the decoding result. The NodeB can absolutely receive the whole TFCI of the terminal within 20 ms. The terminal performs decoding for a downlink DPCH at a TTI of 20 ms and does not need to feed back a decoding result.

A basic implementation process of early stop decoding is as follows: a base station performs decoding for an uplink DPDCH earlier, e.g. after 7 slots, and feeds back a decoding result. When adopting this method, a TFCI can be hardly obtained according to a common feedback method of the related art, and a terminal also needs to perform decoding for a downlink DPCH earlier and feed back a decoding result.

In an embodiment of the present disclosure, a terminal reduces the encoded TFCI, to 21 bits for example, and increases the proportion of a TFCI domain, from the original 2 bits of each slot to 3 bits for example, thus a NodeB only needs 7 slots to obtain the TFCI. When adopting this method, the NodeB can perform decoding for an uplink DPDCH and feeds back a decoding result. The terminal can perform decoding for a downlink DPCH at any time (from the first or second slot). However, since the terminal needs to feed back the decoding result and an idle TFCI domain of a DPCCH may be used for feedback, the decoding can be performed earlier only after transmission of the reduced TFCI is finished, e.g. at the eighth slot.

It can be seen from the description above that, the embodiments of the present disclosure can fully use a TFCI domain of a DPCCH without increasing hardware and software complexity, save the transmitting power of a UE without adding a new code channel, and can decrease the number of times for a terminal and a NodeB to try early stop decoding, thereby saving decoding resources.

Although the example embodiments of the present disclosure have been disclosed for illustrative purposes, those skilled in the art will realize that various modifications, additions and substitutions are possible. Therefore, the scope of the present disclosure shall not be limited by the embodiments above.

INDUSTRIAL APPLICABILITY

The technical solution of the embodiments of the present disclosure is applied to the field of mobile communication to solve at least one of the problems in the related art that a NodeB side cannot obtain a TFCI in time and a terminal side cannot feed back a downlink decoding result in time during early stop decoding. By virtue of the technical solution provided in the embodiments of the present disclosure, without adding a new code channel, a TFCI domain of a DPCCH is fully used, and the transmitting power of a terminal is saved. Meanwhile, the number of times for the terminal and the NodeB to try early stop decoding is decreased, thus decoding resources are saved.

What is claimed is:

1. A method for feeding back early stop decoding, comprising:
   a terminal side adjusting encoded Transport Format Combination Indicator (TFCI) bits, and sending the adjusted TFCI bits to a Node B (NodeB) side via a TFCI domain of an uplink Dedicated Physical Control Channel (DPCCH);
   after sending the adjusted TFCI bits to the NodeB side, the terminal side feeding back, via an idle TFCI domain of the uplink DPCCH, a decoding result of a downlink Dedicated Physical Channel (DPCH) to the NodeB side;
   wherein the decoding result is obtained through performing, by the terminal side, the decoding operation on the downlink DPCH after the terminal side sends the adjusted TFCI bits to the NodeB side and the decoding result is used for indicating a result of the early stop decoding.

2. The method according to claim 1, wherein the terminal side adjusting the encoded TFCI bits comprises:
   the terminal side performing a reduction operation on original TFCI bits; and/or
   the terminal side encoding the original TFCI bits by using a high code rate encoding method.

3. The method according to claim 1, wherein before sending the adjusted TFCI bits to the NodeB side via the TFCI domain of the uplink DPCCH, the method further comprises:
   the terminal side increasing proportion of the TFCI domain in the uplink DPCCH.

4. The method according to claim 1, further comprising:
   the terminal side increasing transmitting power of the TFCI domain of the uplink DPCCH.

5. A method for feeding back early stop decoding, comprising:
   a Node B (NodeB) side receiving encoded Transport Format Combination Indicator (TFCI) bits sent by a terminal side, wherein the encoded TFCI bits are TFCI bits obtained after the terminal side performs a bit reduction operation;
   the NodeB side performing a decoding operation on the received TFCI bits, performing, according to a decoding result of the decoding operation performed on the received TFCI bits, a decoding operation on an uplink Dedicated Physical Control Channel (DPCCH), and feeding back a decoding result of the decoding operation performed on the uplink DPDCH to the terminal side;
   wherein the decoding result is obtained through performing, by the terminal side, the decoding operation on the downlink DPCH after the terminal side sends the adjusted TFCI bits to the NodeB side and the decoding result is used for indicating a result of the early stop decoding.

6. The method according to claim 5, wherein the terminal side performing the bit reduction operation comprises:
   the terminal side performing the bit reduction operation on original TFCI bits, and/or
   the terminal side encoding the original TFCI bits by using a high code rate encoding method.

7. An apparatus for feeding back early stop decoding, wherein the apparatus is applied to a terminal side and comprises:
   an adjusting component, configured to adjust encoded Transport Format Combination Indicator (TFCI) bits, and send the adjusted TFCI bits to a Node B (NodeB) side via a TFCI domain of an uplink Dedicated Physical Control Channel (DPCCH);
   a feedback component configured to, after the adjusted TFCI bits are sent to the NodeB side, feed back, via an idle TFCI domain of the uplink DPCCH, a decoding result of a downlink Dedicated Physical Channel (DPCH) to the NodeB side;
   wherein the decoding result is obtained through performing, by the terminal side, the decoding operation on the downlink DPCH after the terminal side sends the adjusted TFCI bits to the NodeB side and the decoding result is used for indicating a result of the early stop decoding.

8. The apparatus according to claim 7, wherein the adjusting component comprises:
   a reducing element, configured to perform a reduction operation on original TFCI bits; and/or
   an encoding element, configured to encode, by the terminal side, the original TFCI bits by using a high code rate encoding method.

9. An apparatus for feeding back early stop decoding, wherein the apparatus is applied to a Node B (NodeB) side and comprises:
   a receiving component, configured to receive encoded Transport Format Combination Indicator (TFCI) bits sent by a terminal side, wherein the encoded TFCI bits are TFCI bits obtained after the terminal side performs a bit reduction operation;
   a decoding operation component, configured to perform a decoding operation on the received TFCI bits;
   a decoding feedback component, configured to perform, according to a decoding result of the decoding operation performed on the received TFCI bits, a decoding operation on an uplink Dedicated Physical Control Channel (DPCCH), and feed back a decoding result of the decoding operation performed on the uplink DPDCH to the terminal side;
   wherein the decoding result is obtained through performing, by the terminal side, the decoding operation on the downlink DPCH after the terminal side sends the adjusted TFCI bits to the NodeB side and the decoding result is used for indicating a result of the early stop decoding.

10. A system for feeding back early stop decoding, comprising an apparatus for feeding back early stop decoding, which is applied to a terminal side, and the apparatus for feeding back early stop decoding, which is applied to a NodeB side, according to claim 9, wherein the apparatus for feeding back early stop decoding, which is applied to the terminal side comprises:
   an adjusting component, configured to adjust encoded Transport Format Combination Indicator (TFCI) bits, and send the adjusted TFCI bits to a Node B (NodeB) side via a TFCI domain of an uplink Dedicated Physical Control Channel (DPCCH) to reduce transmission time of the TFCI bits;
   a feedback component configured to, after the adjusted TFCI bits are sent to the NodeB side, feed back, via an idle TFCI domain of the uplink DPCCH, a decoding result of a downlink Dedicated Physical Channel (DPCH) to the NodeB side by means of time division multiplexing;
   wherein the decoding result is obtained through performing, by the terminal side, the decoding operation on the downlink DPCH after the terminal side sends the adjusted TFCI bits to the NodeB side and the decoding result is used for indicating a result of the early stop decoding.

11. The apparatus according to claim 7, wherein the terminal side is configured to increase proportion of the TFCI domain in the uplink DPCCH before the adjusting component sends the adjusted TFCI bits to the NodeB side via the TFCI domain of the uplink DPCCH.

12. The apparatus according to claim 7, wherein the terminal side is configured to increase transmitting power of the TFCI domain of the uplink DPCCH.

13. The apparatus according to claim 9, wherein the terminal side performing the bit reduction operation comprises:
   the terminal side performing the bit reduction operation on original TFCI bits, and/or
   the terminal side encoding the original TFCI bits by using a high code rate encoding method.

14. The system for feeding back early stop decoding according to claim 10, wherein the adjusting component comprises:
   a reducing element, configured to perform a reduction operation on original TFCI bits; and/or
   an encoding element, configured to encode, by the terminal side, the original TFCI bits by using a high code rate encoding method.

15. The system according to claim 10, wherein the terminal side is configured to increase proportion of the TFCI domain in the uplink DPCCH before the adjusting component sends the adjusted TFCI bits to the NodeB side via the TFCI domain of the uplink DPCCH.

16. The system according to claim 10, wherein the terminal side is configured to increase transmitting power of the TFCI domain of the uplink DPCCH.

* * * * *